United States Patent
Naem

(10) Patent No.: US 6,649,482 B1
(45) Date of Patent: Nov. 18, 2003

(54) BIPOLAR TRANSISTOR WITH A SILICON GERMANIUM BASE AND AN ULTRA SMALL SELF-ALIGNED POLYSILICON EMITTER AND METHOD OF FORMING THE TRANSISTOR

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/882,740

(22) Filed: Jun. 15, 2001

(51) Int. Cl.[7] ............................................. H01L 21/331
(52) U.S. Cl. ....................... 438/361; 438/312; 438/357
(58) Field of Search ............................ 438/361, 312, 438/320, 357, 341, 363, 717

(56) References Cited

U.S. PATENT DOCUMENTS

| | | | | |
|---|---|---|---|---|
| 4,564,997 A | * | 1/1986 | Matsuo et al. ............ | 29/576 W |
| 5,320,972 A | * | 6/1994 | Wylie ......................... | 438/438 |
| 5,323,032 A | * | 6/1994 | Sato et al. .................. | 257/198 |
| 5,897,359 A | * | 4/1999 | Cho et al. ................... | 438/312 |
| 6,171,936 B1 | * | 1/2001 | Fitzgerald .................. | 438/503 |
| 6,352,907 B1 | * | 3/2002 | Gris ............................ | 438/438 |

FOREIGN PATENT DOCUMENTS

| | | | |
|---|---|---|---|
| EP | 779663 | * | 6/1997 |
| JP | 02260430 | * | 10/1990 |
| JP | 4082268 | * | 4/1992 |
| JP | 06318602 | * | 11/1994 |

OTHER PUBLICATIONS

IBM Tech. Discl. Bull. vol. 34, No. 1, (Jun. 1991) pp. 422–424. "Epi–based bipolar transistor with oxide–defined collector window".*

C.A. King et al., "Very Low Cost Graded SiGe Base Bipolar Transistor for a High–Performance Modular BiCMOS Process", IEDM, 1999, pps. 565–568.

Wim van der Wel et al., "Poly–Ridge Emitter Transistor (PRET): Simple Low–Power Option to a Bipolar Process", IEDM, 1993, pps. 453–456.

* cited by examiner

*Primary Examiner*—Caridad Everhart
(74) *Attorney, Agent, or Firm*—Mark C. Pickering

(57) ABSTRACT

A low-power bipolar transistor is formed to have a silicon germanium base region, an intrinsic emitter region with a sub-lithographic width, and an oxide layer that is self aligned to an overlying extrinsic emitter. The silicon germanium base region increases the speed of the transistor, while the small extrinsic emitter region reduces the maximum current that can flow through the transistor, and the self-aligned oxide layer and extrinsic emitter reduces the base-to-emitter junction size and device performance variability across the wafer.

30 Claims, 5 Drawing Sheets

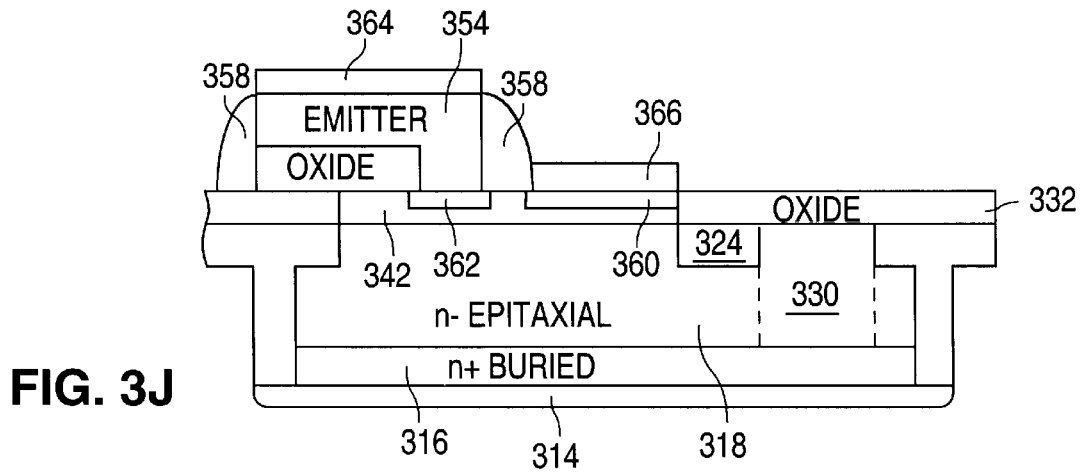
FIG. 3J
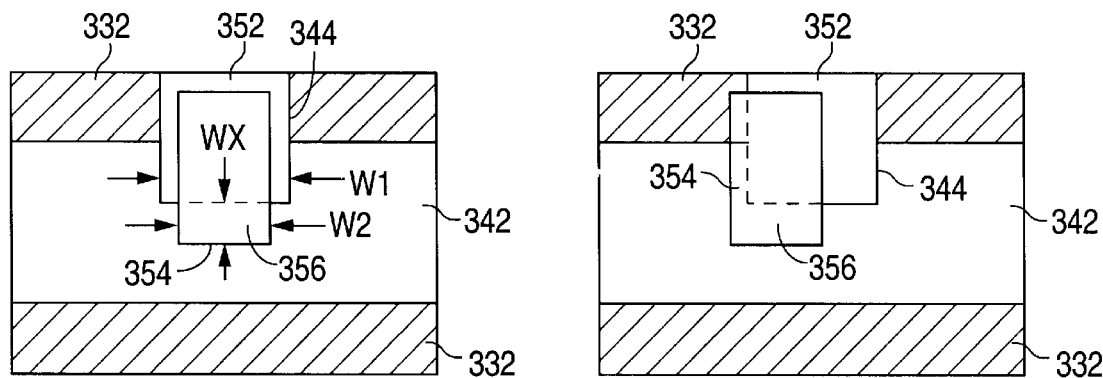
FIG. 4  FIG. 5
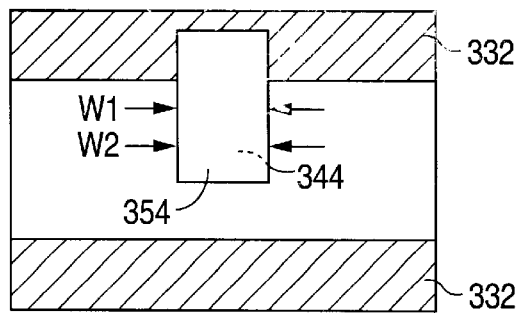
FIG. 6

BIPOLAR TRANSISTOR WITH A SILICON GERMANIUM BASE AND AN ULTRA SMALL SELF-ALIGNED POLYSILICON EMITTER AND METHOD OF FORMING THE TRANSISTOR

RELATED APPLICATION

The present invention is related to application Ser. No. 09/882,915, pending, for "Bipolar Transistor with Ultra Small Self-Aligned Polysilicon Emitter and Method of Forming the Transistor" by Abdalla Aly Naem filed on an even date herewith.

BACKGROUND OF THE INVENTION

1. Field of the Invention

The present invention relates to a bipolar transistor and, more particularly, to a bipolar transistor with a silicon germanium base and an ultra-small, self-aligned polysilicon emitter, and a method of forming the transistor.

2. Description of the Related Art

A bipolar transistor is a three-terminal device that can, when properly biased, controllably vary the magnitude of the current that flows between two of the terminals. The three terminals include a base terminal, a collector terminal, and an emitter terminal. The charge carriers, which form the current, flow between the collector and the emitter terminals, while variations in the voltage on the base terminal cause the magnitude of the current to vary.

Due to the increasing speed of, and demand for, battery-powered devices, there is a need for a faster bipolar transistor that utilizes less power. Increased speed can be obtained by using a silicon germanium base. Lower power consumption can be obtained by reducing the maximum current that can flow between the two terminals.

One approach for reducing the maximum current is to reduce the size of the base-to-emitter junction, preferably to sub-lithographic feature sizes. FIG. 1 shows a cross-sectional diagram that illustrates a portion of a prior-art bipolar transistor 100 that has a base-to-emitter junction with a sub-lithographic width.

As shown in FIG. 1, transistor 100 includes a collector layer 110, a base layer 112 that is formed on collector layer 110, and a field oxide region FOX that adjoins layer 112. In addition, transistor 100 includes a thin oxide layer 114 that is formed on a portion of base layer 112 and the field oxide region FOX, and an n+ extrinsic emitter 116 that is formed on thin oxide layer 114.

As further shown in FIG. 1, transistor 100 also includes an n+ intrinsic emitter region 118 that is formed in base layer 112, and an n+ poly ridge 120 that is connected to extrinsic emitter 116 and n+ intrinsic emitter region 118. Extrinsic emitter 116, intrinsic emitter region 118, and poly ridge 120 form the emitter of transistor 100.

Transistor 100 additionally includes a base silicide contact 122 that is formed on base layer 112, and an emitter silicide contact 124 that is formed on extrinsic emitter 116. In addition, an oxide spacer 126 is formed on base layer 112 between poly ridge 120 and base contact 122.

During fabrication, poly ridge 120 is formed to have a maximum width (measured laterally) that is smaller than the minimum feature size that is obtainable with a given photolithographic process. After poly ridge 120 has been formed, emitter region 118 is formed during an annealing step which causes dopants to outdiffuse from poly ridge 120 into base layer 112.

As a result, a very small base-to-emitter junction results. A small base-to-emitter junction limits the magnitude of the current that can flow through transistor 100. Reduced current, in turn, provides low-power operation. (See "Poly Emitter Transistor (PRET): Simple Low Power Option to a Bipolar Process," Wim van der Wel, et al., IEDM 93-453, 1993, pp. 17.6.1–17.6.4.)

One drawback of transistor 100, however, is that transistor 100 requires the added cost and complexity of a double polysilicon process (extrinsic emitter 116 is formed from a first polysilicon (poly-1) layer, while poly ridge 120 is formed from a second polysilicon (poly-2) layer). In addition, emitter dopant diffusion into base 112 can be less, compared to a conventional single-poly device architecture, due to the possible presence of oxide at the poly1-to-poly2 interface (emitter 116 to poly ridge 120 interface).

Another drawback of transistor 100 is that, although FIG. 1 shows oxide spacer 126 formed on poly ridge 120, in actual practice it is difficult to form an oxide side-wall spacer on a sloped surface. Gaps can result which, in turn, can lead to an electrical short circuit between base layer 112 and extrinsic emitter 116 following the salicidiation process (the process that forms base silicide contact 122 and emitter silicide contact 124). Silicide is not formed on oxide. Thus it is critical that a uniformly thick layer of oxide (spacer 126) separate base layer 112 from extrinsic emitter 116.

A further drawback of transistor 100 is that the slope of the end wall of extrinsic emitter 116 can effect the width of poly ridge 120. Although FIG. 1 shows extrinsic emitter 116 with a vertical end wall, in actual practice, the end wall is often non-vertical, and non-uniform across a wafer that has a number of bipolar transistors. This, in turn, can result in the bipolar transistors having varying performances.

An additional drawback of transistor 100 is that poly ridge 120 is formed around and in contact with each side wall of extrinsic emitter 116. A plan view of extrinsic emitter 116 would show emitter 116 with a square or rectangular shape with poly ridge 120 surrounding emitter 116. As a result, transistor 100 has a large base-to-emitter contact area and a high base-to-emitter capacitance.

Thus, there is a need for a low-power bipolar transistor with a sub-lithographic base-to-emitter junction that reduces, or preferably eliminates, the previously-described drawbacks.

SUMMARY OF THE INVENTION

The present invention provides a bipolar transistor that is formed with a silicon germanium base in a single polysilicon process. The present invention also has an extrinsic emitter with a substantially vertical end wall. The vertical end wall allows a standard oxide side-wall spacer to be formed adjacent to the extrinsic emitter, thereby reducing the likelihood of any base-to-emitter short circuits.

In addition, the present invention forms a sub-lithographic emitter region that reduces the maximum current that can flow through the transistor, thereby reducing power consumption. The present invention also reduces the base-to-emitter capacitance by limiting the base-to-emitter contact area.

The bipolar transistor of the present invention is formed on a wafer that has a buried layer, and an epitaxial layer of a first conductivity type that is formed over the buried layer. The epitaxial layer has a smaller dopant concentration than the buried layer.

The bipolar transistor has a silicon germanium intrinsic base region of a second conductivity type that is formed on the epitaxial layer. In addition, the transistor has an isolation region that is formed on the surface of the intrinsic base region. The isolation region has a side wall. The transistor also has an extrinsic emitter region that is formed on the isolation region and the intrinsic base region. The extrinsic emitter region has a side wall. The side wall of the extrinsic emitter region is substantially aligned with the side wall of the isolation region. In addition, the region of the extrinsic emitter that contacts the intrinsic base region has a sub-lithographic feature size.

The bipolar transistor further has an intrinsic emitter region that is formed in the intrinsic base region. The intrinsic emitter region contacts the extrinsic emitter region. The transistor additionally has an isolation spacer that is formed on the intrinsic base region to contact the extrinsic emitter.

The present invention also includes a method for forming a low-power bipolar transistor. The bipolar transistor is formed on a wafer that has a buried layer, and an epitaxial layer of a first conductivity type that is formed over the buried layer. The epitaxial layer has a smaller dopant concentration than the buried layer.

The method of the present invention begins by forming a layer of first isolation material on the epitaxial layer. Next, a layer of second isolation material is formed on the layer of first isolation material. After this, a portion of the layer of second isolation material and an underlying portion of the layer of first isolation material are etched to form an exposed region of the epitaxial layer.

The method continues by depositing a layer of first conductive material on the layers of first and second isolation materials and the exposed region of the epitaxial layer. Following this, the layer of first conductive material is planarized to form an intrinsic base region that is surrounded by the layer of first isolation material.

In addition, the method of the present invention can further include the step of forming an isolation region on the intrinsic base region. The method can additionally include the steps of forming a layer of conductive material on the isolation region and the intrinsic base region, and etching the layer of conductive material to form an extrinsic emitter on the isolation region and the intrinsic base region.

The method can further include the step of etching the isolation region such that a side wall of the extrinsic emitter and a side wall of the isolation region are substantially aligned. The method can additionally include the steps of forming an intrinsic emitter region in the intrinsic base region, and forming a side-wall spacer on the intrinsic base region to adjoin the extrinsic emitter.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 3A–3J are cross-sectional drawings illustrating a method of forming a bipolar transistor in accordance with the present invention.

FIG. 4 is a plan view illustrating top surface 352 of oxide layer 344 following the etch of poly layer 348 in accordance with the present invention.

FIG. 5 is a plan view illustrating top surface 352 of oxide layer 344 following a misaligned etch of poly layer 348 when widths W1 and W2 are initially formed to be the same.

FIG. 6 is a plan view illustrating extrinsic emitter 354 following the etch of oxide layer 344 in accordance with the present invention.

DETAILED DESCRIPTION

Figure 1:
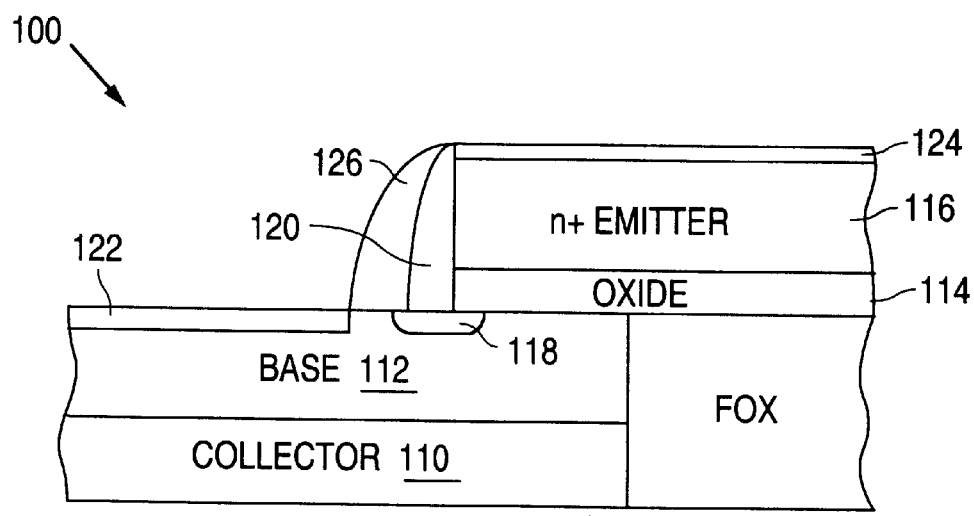
FIG. 1 is a cross-sectional diagram illustrating a portion of a prior-art bipolar transistor 100 that has a base-to-emitter junction with a sub-lithographic width.
Figure 2:
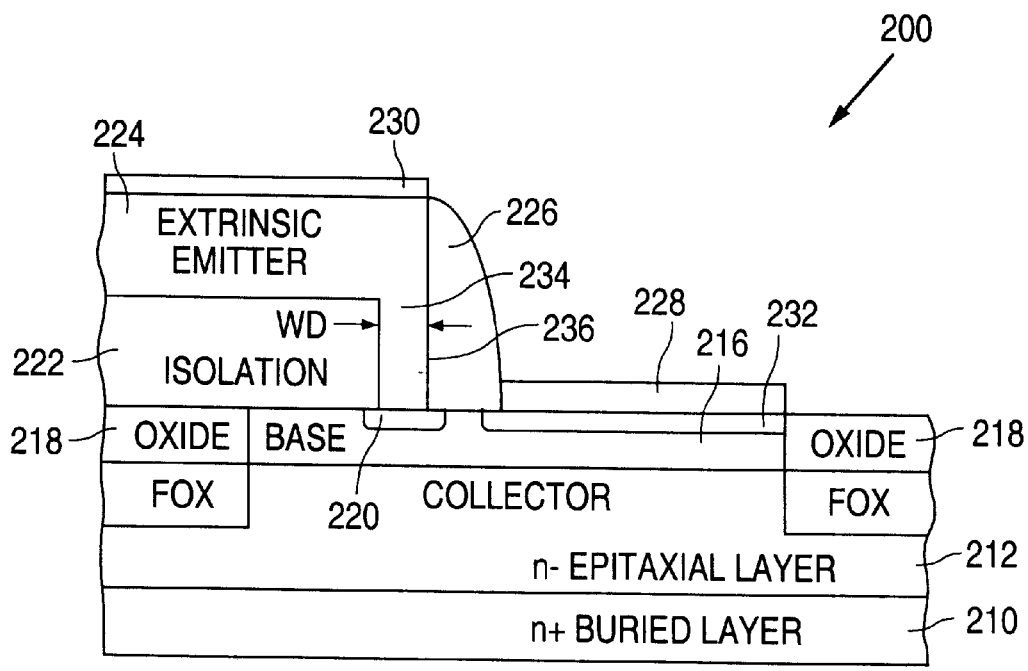
FIG. 2 is a cross-sectional view illustrating a portion of a bipolar transistor 200 in accordance with the present invention.

FIG. 2 is a cross-sectional view that illustrates a portion of a bipolar transistor 200 in accordance with the present invention. As shown in FIG. 2, transistor 200 is formed on a wafer that has an n+ buried layer 210, an n− epitaxial layer 212 that is formed over n+ buried layer 210, and a field oxide region FOX that adjoins layer 212. N+ buried layer 210 and n− epitaxial layer 212 form the collector of transistor 200.

As further shown in FIG. 2, transistor 200 includes a p− silicon germanium intrinsic base 216 that is formed on n− epitaxial layer 212, and an oxide layer 218 formed on the field oxide region FOX to surround base 216. By using silicon germanium to form base 216, the speed of transistor 200 is enhanced.

In addition, transistor 200 includes an n+ intrinsic emitter region 220 that is formed in p− intrinsic base 216, and a layer of isolation material 222 that is formed on intrinsic base 216 and oxide layer 218. Transistor 200 further includes an extrinsic emitter 224 that is formed on isolation layer 222, and an oxide spacer 226 that is formed on base 216 adjacent to extrinsic emitter 224.

Transistor 200 also includes a base silicide layer 228 that is formed on base 216, and an emitter suicide layer 230 that is formed on extrinsic emitter 224. Transistor 200 further includes an extrinsic base region 232 that is formed in base 216. Extrinsic base region 232 has a higher dopant concentration than base 216.

As described in greater detail below, silicon germanium intrinsic base 216 is formed in a base window in a self-aligned process that does not require a mask. In addition, the side walls of isolation layer 222 and extrinsic emitter 224 (which are formed over both base region 216 and oxide layer 218 in the plane parallel to the page) are formed to be substantially aligned.

Further, the method of the present invention forms extrinsic emitter 224 such that an end region 234 of emitter 224 has a width WD that is less than the minimum feature size that can be obtained from the present photolithographic process used to form the wafer. This allows intrinsic emitter region 220 to be very small which, in turn, reduces the size of the base-to-emitter junction.

In addition, extrinsic emitter 224 is formed to have a vertical end wall 236. The advantage of vertical end wall 236 is that a conventional (full height and width) oxide side-wall spacer can then be formed next to vertical end wall 236, thereby providing the necessary base-to-emitter isolation. In addition, vertical end wall 236 minimizes the variability of width WD. Further, emitter 224 is formed to have a high dopant concentration which, as a result of the present method, also allows intrinsic emitter region 220 to have a high dopant concentration.

Figure 3A:
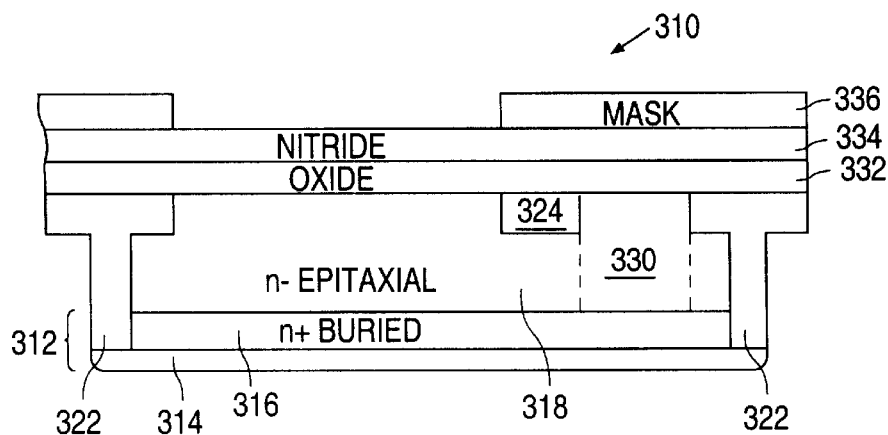

FIGS. 3A–3J are cross-sectional views that illustrate a method of forming bipolar transistor 200 in accordance with the present invention. As shown in FIG. 3A, the method utilizes a conventionally-formed wafer 310 that has a semiconductor layer 312. Semiconductor layer 312, in turn, has a substrate layer 314, such as silicon or oxide, and an n+ buried layer 316. In addition, wafer 310 also has a lightly-doped, n-type epitaxial layer 318 that is formed on n+buried layer 316.

Wafer 310 further has a deep trench isolation region 322 that isolates epitaxial layer 318 from laterally adjacent regions. A shallow trench isolation region 324 is also formed in epitaxial layer 318. The shallow trench isolation region 324 separates a collector area from a base area of the to-be-formed bipolar transistor.

In addition, wafer 310 can optionally include an n+ diffused contact region 330 that extends down from the surface of the collector area in epitaxial layer 318 to contact n+ buried layer 316. Contact region 330 is utilized to reduce the series resistance to buried layer 316. N+ buried layer 316, n– epitaxial layer 318, and optional n+ diffused contact region 330 define the collector of the to-be-formed bipolar transistor.

As shown in FIG. 3A, the method of the present invention begins by forming a layer of oxide 332 approximately 40 nm thick on epitaxial layer 318 and contact region 330. Once oxide layer 332 has been formed, a layer of nitride 334 approximately 40 nm thick is formed on oxide layer 332.

Following this, a base definition mask 336 is formed and patterned on nitride layer 334 to expose a region of nitride layer 334. Once mask 336 has been patterned, the exposed regions of nitride layer 334 and underlying oxide layer 332 are etched away to expose a base window on the surface of epitaxial layer 318. Mask 336 is then stripped.

Figure 3B:
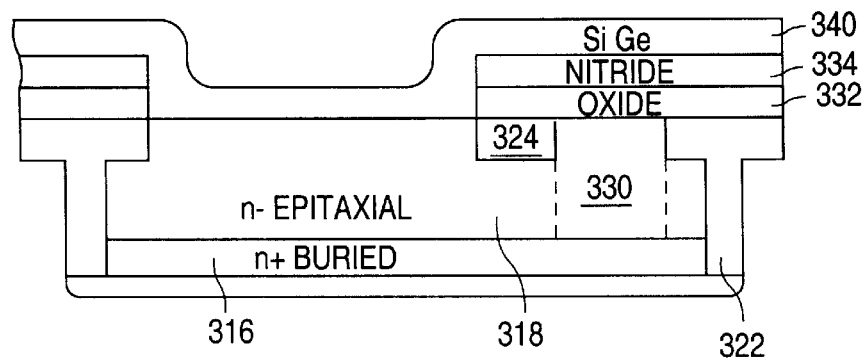

Next, as shown in FIG. 3B, a layer of silicon germanium 340 is blanket deposited on nitride layer 334, the side walls of oxide layer 332, and epitaxial layer 318 in the base window. After silicon germanium layer 340 has been deposited, layer 340 is doped with a p-type dopant using conventional methods, such as ion implantation and diffusion, to have a conductivity type opposite that of n– epitaxial layer 318.

Figure 3C:
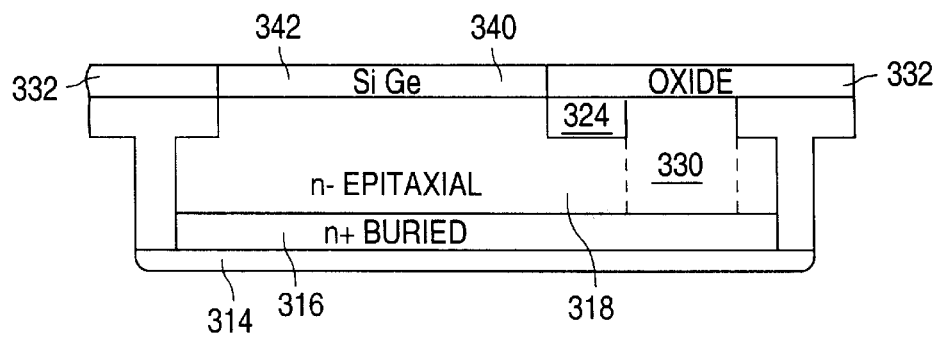

After this, as shown in FIG. 3C, silicon germanium layer 340 and nitride layer 334 are planarized using a conventional approach, such as chemical-mechanical polishing, until nitride layer 334 has been removed from the surface of oxide layer 332. (The etch can alternately be stopped when silicon germanium layer 340 has been removed from the surface of nitride layer 334.)

The planarizing forms a silicon germanium intrinsic base 342 that is self-aligned with, and isolated by, a surrounding layer of oxide 332 without using a mask. Thus, the area of base 342 and the location of the base-to-collector interface are defined by the area and location of mask 336.

The present method of forming intrinsic base 342 is substantially less complex that the selective growth techniques that are conventionally used to form a silicon germanium base region. With selective growth techniques, a layer of oxide is etched to form a window that exposes a portion of the underlying epitaxial layer, and then a silicon germanium base is grown in the window on the epitaxial layer. The silicon germanium-to-surrounding oxide interface, however, is typically poor and can effect transistor performance.

Figure 3D:
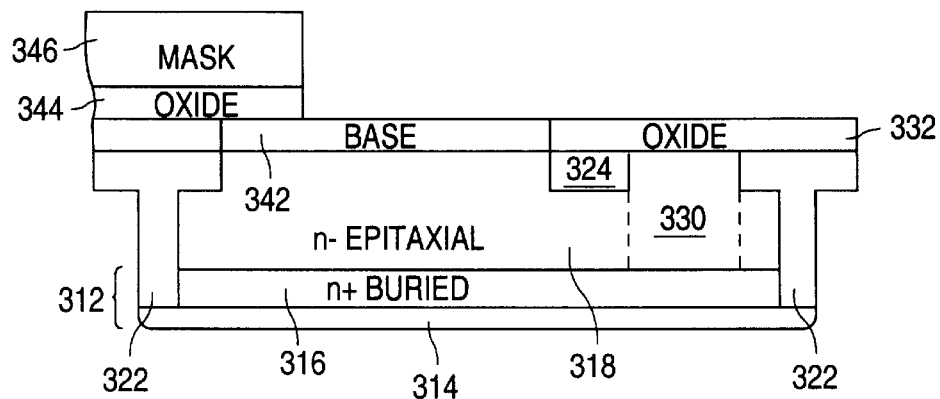

Next, as shown in FIG. 3D, a layer of oxide 344 approximately 20 nm is formed on oxide layer 332 and intrinsic base 342. Following this, an oxide definition mask 346 is formed and patterned on oxide layer 344 to expose a region of oxide layer 344. Once mask 346 has been patterned, the exposed regions of oxide layer 344 are etched away to expose the surface of intrinsic base 342. Mask 346 is then stripped.

Figure 3E:
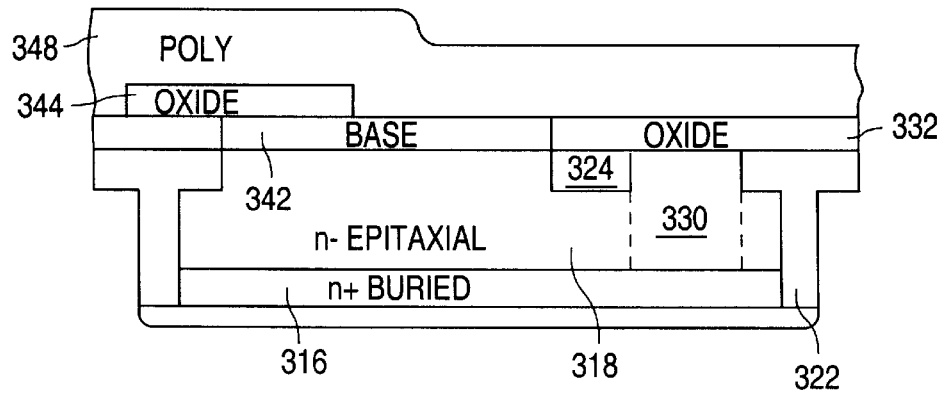

Next, as shown in FIG. 3E, a layer of polysilicon (poly) 348 approximately 250 nm thick is deposited on oxide layer 332, intrinsic base 342, and oxide layer 344. Poly layer 348 is conventionally doped with phosphorous or arsenic, such as by ion implantation or diffusion, to have a high (n+) dopant concentration.

Figure 3F:
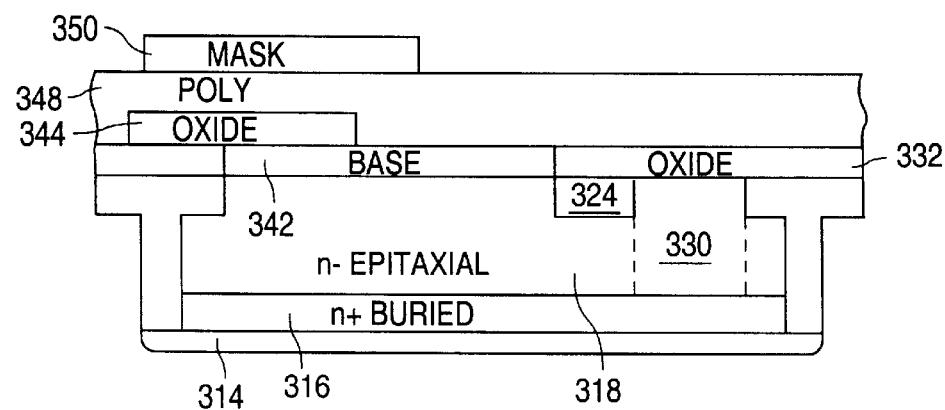

As shown in FIG. 3F, after poly layer 348 has been doped, poly layer 348 is planarized using a conventional approach, such as chemical-mechanical-polishing, to have a single-level top surface. Following this, a poly-etch mask 350 is formed and patterned on poly layer 348. Mask 350 is patterned to define the footprint of the to-be-formed extrinsic emitter which, in turn, includes the length and width of an end region.

Figure 3G:
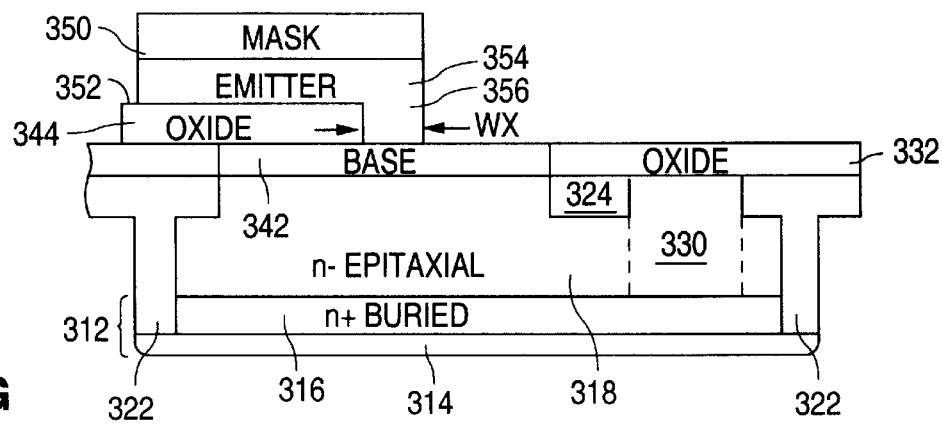

As shown in FIG. 3G, once mask 350 has been patterned, the exposed regions of poly layer 348 are etched away to expose the top surface of intrinsic base 342, expose a top surface 352 of oxide layer 344, and form an extrinsic emitter 354 that contacts base 342. Extrinsic emitter 354 has an end 356 that has a width WX (width WD in FIG. 2) and a length of, for example, 100 nm×150 nm. The etch is a timed etch, and care must be exercised to insure that the surface of intrinsic base 342 is not overetched. Following this, mask 350 is stripped.

FIG. 4 shows a plan view that illustrates top surface 352 of oxide layer 344 following the etch of poly layer 348 in accordance with the present invention. As shown in FIG. 4, oxide layer 344 has a width W1 that is wider than a width W2 of extrinsic emitter 354 (width W2 is equal to the length of end 356). Width W1 is larger than width W2 to accommodate misalignment error and insure that only end 356 of extrinsic emitter 354 contacts intrinsic base 342.

FIG. 5 shows a plan view that illustrates top surface 352 of oxide layer 344 following a misaligned etch of poly layer 348 when widths W1 and W2 are initially formed to be the same. As shown in FIG. 5, the area of top surface 352 is greater than the area of top surface 352 shown in FIG. 4 because one side of extrinsic emitter 354 is off of oxide layer 344 and in contact with p– intrinsic base 342. If more than the end 356 of extrinsic emitter 354 is formed on base 342, then device performance can be significantly altered. This type of misalignment can vary across the wafer causing device performance variability.

In accordance with the present invention, after poly layer 348 has been etched, top surface 352 and the underlying regions of oxide layer 344 are selectively removed with a wet etch. The etch self-aligns oxide layer 344 to the overlying extrinsic emitter 354. To avoid further etching of the top surface of intrinsic base 342, an etchant with a very high selectivity for silicon germanium should be utilized.

FIG. 6 shows a plan view that illustrates extrinsic emitter 354 following the etch of oxide layer 344 in accordance with the present invention. As shown in FIG. 6, in the present invention, width W1 and width W2 are substantially the same. By reducing the width W1 to be substantially equal to the width W2, the base-to-emitter contact area is substantially reduced which, in turn, reduces the base-to-emitter capacitance.

Figure 3H:
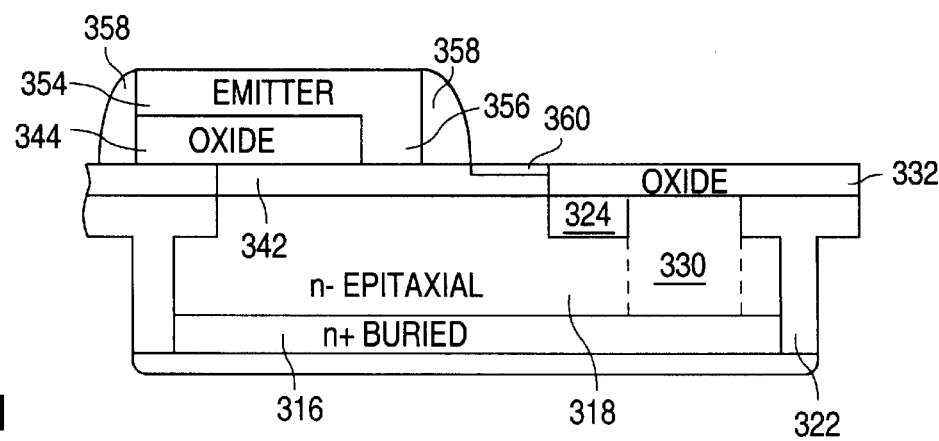

Returning to FIG. 3G, after mask 350 has been removed, a layer of isolation material (not shown), such as oxide, approximately 300 nm thick is formed on intrinsic base 342 and extrinsic emitter 354. Next, as shown in FIG. 3H, the layer of isolation material is anisotropically etched to form isolation side-wall spacers 358.

Once side wall spacers 358 have been formed, wafer 310 is blanket implanted with a p-type dopant to form an extrinsic base region 360 in intrinsic base region 342. (A blanket implant can be used as the dopant concentration of extrinsic emitter 354 is substantially greater.)

Figure 3I:
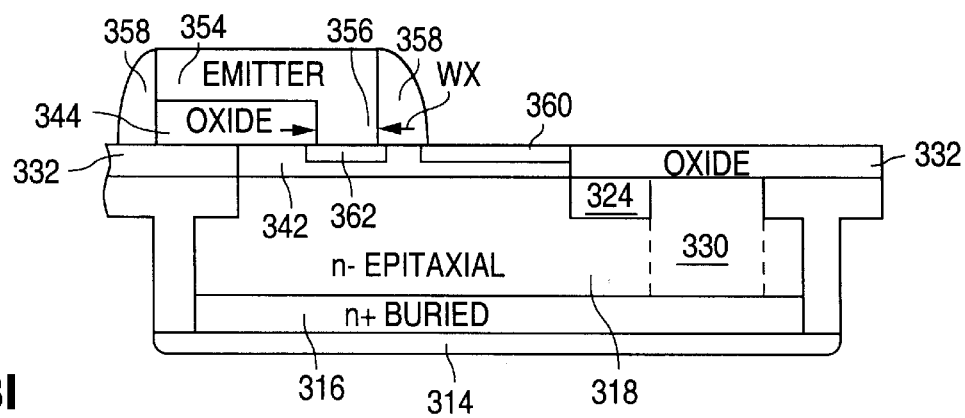

Next, as shown in FIG. 3I, wafer 310 is subject to rapid thermal annealing (RTA). During the RTA process, dopants from n+ extrinsic emitter 354 diffuse into p– intrinsic base 342 to form an n+ intrinsic emitter region 362 in intrinsic base 342. The RTA process also activates the implants. (Intrinsic emitter region 362 has a high dopant concentration due to the high dopant concentration of extrinsic emitter 354.)

One of the advantages of the present invention is that end 356 can be formed to have a sub-lithographic width WX. (Although an end 356 having a width and length of 100 nm×150 nm was described earlier, an end 356 with a width and length of, for example, 50 nm×150 nm is also possible using the same photolithographic process). As a result, intrinsic emitter region 362 can also be formed to have a smaller size. The smaller size of intrinsic emitter region 362, in turn, reduces the magnitude of the current that can flow through the bipolar transistor, thereby reducing the power consumption.

Following this, as shown in FIG. 3J, a layer of metal is formed over intrinsic base 342, extrinsic emitter 354, and spacers 358. The layer of metal is then reacted (heated) to form an emitter silicide layer 364 and a base silicide layer 366. (Silicon is consumed when layers 364 and 366 are formed by direct reaction.) The metal does not react with the material used to form spacers 358, and is subsequently removed. The method then continues with conventional steps.

Thus, a method for forming a bipolar transistor in accordance with the present invention has been described. The present method forms a silicon germanium intrinsic base 342 that is self-aligned with, and isolated by, a surrounding layer of oxide 332 without using a mask. In addition, the area of base 342 and the location of the base-to-collector interface are defined by the area and location of mask 336.

Further, the present method reduces the base-to-emitter contact area, and thereby the base-to-emitter capacitance, by forming oxide layer 344 to be self-aligned with extrinsic emitter 354. In addition, the present method reduces the maximum current, and thereby the power, that is consumed by the bipolar transistor by forming a small intrinsic emitter region.

Another one of the advantages of the present invention is that transistor 200 is formed with a single polysilicon fabrication process. This is much less expensive and complex than a double polysilicon process. Further, since the poly-1 to poly-2 interface has been eliminated, dopant diffusion is enhanced during the RTA step. In addition, the method forms an extrinsic base with a higher dopant concentration than intrinsic base 342.

It should be understood that various alternatives to the method of the invention described herein may be employed in practicing the invention. For example, although the method is described with respect to npn transistors, the method applies equally well to pnp transistors where the conductivity types are reversed.

In addition, the present method can be incorporated into a BiCMOS process. Thus, it is intended that the following claims define the scope of the invention and that methods and structures within the scope of these claims and their equivalents be covered thereby.

What is claimed is:

1. A method for forming a bipolar transistor on a wafer, the wafer having a buried layer, an epitaxial layer of a first conductivity type formed over the buried layer and having a smaller dopant concentration than the buried layer, the method comprising the steps of:

forming a layer of first isolation material on the epitaxial layer;

forming a layer of second isolation material on the layer of first isolation material;

etching a portion of the layer of second isolation material and an underlying portion of the layer of first isolation material to form an exposed region of the epitaxial layer;

forming a layer of first conductive material on the layers of first and second isolation materials and the exposed region of the epitaxial layer;

planarizing the layer of first conductive material to form an intrinsic base region surrounded by the layer of first isolation material.

2. The method of claim 1 wherein the planarizing step removes the layer of second isolation material from the layer of first isolation material.

3. The method of claim 2 wherein an area and location of a base-to-collector junction is defined by an area and location of the portion of the layer of second isolation material.

4. The method of claim 1 wherein the layer of conductive material is formed by a blanket deposition.

5. A method for forming a bipolar transistor on a wafer, the wafer having a buried layer, an epitaxial layer of a first conductivity type formed over the buried layer and having a smaller dopant concentration than the buried layer, the method comprising the steps of:

forming a layer of first isolation material on the epitaxial layer;

forming a layer of second isolation material on the layer of first isolation material;

etching a portion of the layer of second isolation material and an underlying portion of the layer of first isolation material to form an exposed region of the epitaxial layer;

forming a layer of first conductive material on the layers of first and second isolation materials and the exposed region of the epitaxial layer, the layer of first conductive material being silicon germanium, and the layer of first conductive material has a second conductivity type; and planarizing the layer of first conductive material to form an intrinsic base region surrounded by the layer of first isolation material, the planarizing removing the layer of second isolation material from the layer of first isolation material.

6. A method for forming a bipolar transistor on a wafer, the wafer having a buried layer, an epitaxial layer of a first conductivity type formed over the buried layer and having a smaller dopant concentration than the buried layer, the method comprising the steps of:

forming a layer of first isolation material on the epitaxial layer;

forming a layer of second isolation material on the layer of first isolation material;

etching a portion of the layer of second isolation material and an underlying portion of the layer of first isolation material to form an exposed region of the epitaxial layer;

forming a layer of first conductive material on the layers of first and second isolation materials and the exposed region of the epitaxial layer;

planarizing the layer of first conductive material to form an intrinsic base region surrounded by the layer of first isolation material;

forming an isolation region on the intrinsic base region;

forming a layer of second conductive material on the isolation region and the intrinsic base region;

etching the layer of second conductive material to form an extrinsic emitter on the isolation region and the intrinsic base region;

etching the isolation region such that a side wall of the extrinsic emitter and a side wall of the isolation region are substantially aligned;

forming a side-wall spacer on the intrinsic base region to adjoin the extrinsic emitter;

forming an extrinsic base region in the intrinsic base region after the side-wall spacer has been formed; and forming an intrinsic emitter region in the intrinsic base region after the extrinsic base region has been formed.

7. The method of claim 6 wherein the step of forming the isolation region on the intrinsic base region includes the steps of:

forming a layer of third isolation material on the intrinsic base region; and etching the layer of third isolation material to form the isolation region.

8. The method of claim 6 and further comprising the step of planarizing the layer of second conductive material prior to the step of etching the layer of second conductive material.

9. The method of claim 6 wherein the step of etching the layer of second conductive material is a timed etch.

10. The method of claim 6 wherein the extrinsic emitter has an end that contacts the intrinsic base region.

11. The method of claim 10 wherein the end has a substantially vertical end wall, the end wall lying in a plane that is unparallel with a plane that includes substantially all of the side wall of the extrinsic emitter.

12. The method of claim 6 wherein a top surface area of the extrinsic emitter is less than a top surface area of the isolation region.

13. The method of claim 12 wherein a width of the extrinsic emitter is less than a width of the isolation region, the width of the extrinsic emitter and the width of the isolation region being measured along a line substantially perpendicular to a plane that includes substantially all of the side wall of the extrinsic emitter.

14. The method of claim 6 wherein the step of etching the isolation region is a wet etch with an etchant that etches more oxide than silicon.

15. The method of claim 6 wherein the layer of second conductive material is polysilicon.

16. The method of claim 15 wherein the layer of second conductive material is doped to have the first conductivity type.

17. The method of claim 6 wherein the step of forming an intrinsic emitter region includes the step of annealing the wafer to cause dopants to outdiffuse from the extrinsic emitter into the intrinsic base region.

18. The method of claim 6 wherein a top surface of the extrinsic emitter substantially lies in a plane, and a portion of the side-wall spacer lies in the plane.

19. The method of claim 6 and further comprising the step of forming a base silicide layer on the intrinsic base region and an emitter suicide layer on the extrinsic emitter.

20. The method of claim 19 wherein the step of forming the base silicide layer includes the steps of:

depositing a layer of metal on the extrinsic emitter, the side-wall spacer, and the intrinsic base region; and heating the layer of metal to form the base silicide layer and the emitter silicide layer.

21. A method of forming a bipolar transistor on a wafer, the wafer having a buried layer of a first conductivity type, and an intermediate layer of the first conductivity type formed over the buried layer and having a smaller dopant concentration than the buried layer, the method comprising the steps of:

forming a layer of first isolation material on the intermediate layer;

forming a layer of second isolation material on the layer of first isolation material;

etching a portion of the layer of second isolation material and an underlying portion of the layer of first isolation material to expose a surface region of the intermediate layer;

forming a layer of first conductive material on the surface region of the intermediate layer;

planarizing the layer of first conductive material to form a conductive region surrounded by the layer of first isolation material;

forming an isolation region on the conductive region;

forming a layer of second conductive material on the isolation region and the conductive region; and etching the layer of second conductive material to form an emitter on the isolation region and the conductive region, and expose the conductive region.

22. The method of claim 21 wherein the planarizing step removes the layer of second isolation material from the layer of first isolation material.

23. The method of claim 22 wherein the emitter has a first surface that contacts the isolation region and a second surface that contacts the conductive region, the first surface having a first area and lying in a first plane, the second surface having a second area and lying in a second plane substantially parallel with the first plane, the first area being substantially greater than the second area.

24. A method of forming a bipolar transistor on a wafer, the wafer having a buried layer of a first conductivity type, and an intermediate layer of the first conductivity type formed over the buried layer and having a smaller dopant concentration than the buried layer, the method comprising the steps of:

forming a conductive region on the intermediate layer;

forming an isolation region on the conductive region;

forming a layer of conductive material on the isolation region and the conductive region; and etching the layer of conductive material to form an emitter on the isolation region and the conductive region, and expose the conductive region.

25. The method of claim 24 wherein the emitter includes:

a first surface that contacts the isolation region, the first surface lying in a first plane;

a second surface that contacts the conductive region, the second surface lying in a second plane that is substantially parallel to the first plane, the second surface being smaller than the first surface.

26. The method of claim 25 wherein the conductive region has a second conductivity type.

27. The method of claim 26 wherein the emitter further includes a third surface that contacts the second surface, the third surface lying in a third plane that is substantially perpendicular to the first and second planes; and further comprising the step of forming an isolating side wall spacer on the conductive region, the isolating side wall spacer contacting the third surface of the emitter.

28. The method of claim 27 and further comprising the step of annealing to cause dopant atoms to outdiffuse from the emitter into the conductive region to form an intrinsic emitter region.

29. The method of claim 27 and further comprising the step of implanting dopant atoms of the second conductivity type into the conductive region after the isolating side wall spacers have been formed to form an extrinsic base region in the conductive region.

30. The method of claim 26 wherein the conductive region includes silicon germanium.

* * * * *

UNITED STATES PATENT AND TRADEMARK OFFICE
CERTIFICATE OF CORRECTION

PATENT NO.   : 6,649,482 B1
DATED        : November 18, 2003
INVENTOR(S)  : Abdalla Aly Naem It is certified that error appears in the above-identified patent and that said Letters Patent is hereby corrected as shown below:

<u>Column 4,</u>
Line 35, delete "suicide" and replace with -- silicide --.

<u>Column 9,</u>
Line 65, delete "suicide" and replace with -- silicide --.

Signed and Sealed this

Thirtieth Day of December, 2003

JAMES E. ROGAN
*Director of the United States Patent and Trademark Office*